(12) United States Patent
Tumminelli et al.

(10) Patent No.: US 10,263,133 B2
(45) Date of Patent: Apr. 16, 2019

(54) PHOTOVOLTAIC PLANT

(71) Applicant: ARCHIMEDE RESEARCH S.R.L., Caltanissetta (IT)

(72) Inventors: Gianluca Tumminelli, Caltanissetta (IT); Gaetano Tuzzolino, Caltanissetta (IT); Calogero Gattuso, Caltanissetta (IT)

(73) Assignee: Archimede Research S.R.L., Caltanissetta (IT)

( * ) Notice: Subject to any disclaimer, the term of this patent is extended or adjusted under 35 U.S.C. 154(b) by 133 days.

(21) Appl. No.: 15/113,513

(22) PCT Filed: Jan. 23, 2015

(86) PCT No.: PCT/IB2015/050513
§ 371 (c)(1),
(2) Date: Jul. 22, 2016

(87) PCT Pub. No.: WO2015/110995
PCT Pub. Date: Jul. 30, 2015

(65) Prior Publication Data
US 2017/0012158 A1    Jan. 12, 2017

(30) Foreign Application Priority Data
Jan. 23, 2014  (IT) .............................. TO2014A0050

(51) Int. Cl.
*H01L 31/044* (2014.01)
*H01L 31/054* (2014.01)
(Continued)

(52) U.S. Cl.
CPC ...... *H01L 31/0547* (2014.12); *H01L 31/0475* (2014.12); *H02S 20/10* (2014.12); *H02S 40/22* (2014.12); *Y02E 10/52* (2013.01)

(58) Field of Classification Search
CPC ....... H01L 31/00–31/078; Y02E 10/50–10/60; H02S 10/00–10/40;
(Continued)

(56) References Cited

U.S. PATENT DOCUMENTS 4,141,626 A * 2/1979 Treytl ..................... F24J 2/145
126/606
4,316,448 A * 2/1982 Dodge ................ H01L 31/0547
126/600
(Continued)

FOREIGN PATENT DOCUMENTS

WO    WO 2010/086309 A1    8/2010

*Primary Examiner* — Bach T Dinh
(74) *Attorney, Agent, or Firm* — Robert L. Stearns; Dickinson Wright, PLLC

(57) ABSTRACT

Described herein is a photovoltaic plant (1; 1'; 1"; 1''') including a plurality of photovoltaic modules (PV) arranged in arrays (2) spaced with respect to each other, and wherein the photovoltaic modules (PV) of each array (2) have a first assigned inclination ($\alpha$-1) with respect to a reference direction. Each array (2) of photovoltaic modules (PV) is associated to an array (4; 4'; 4''') of mobile reflection devices (RF) set adjacent thereto, and at least one array (4; 4'; 4''') of mobile reflection devices (RF) is located in a space between successive arrays (2) of photovoltaic modules. The mobile reflection devices (RF) of each array have a second assigned inclination (a2) with respect to a reference direction. The arrays (2) of photovoltaic modules (PV) and the arrays (4; 4'; 4''') of mobile reflection devices (RF) associated to one another includes respective front surfaces (12, 14; 14''') set facing one another, and the mobile reflection devices (RF) of each array are orientable by variation of said second inclination (a2) in order to intercept the incident solar radiation (ISR) and reflect the latter (RSR) towards the photovoltaic modules (PV) of the associated array (2).

15 Claims, 6 Drawing Sheets

(51) Int. Cl.
*H02S 40/22* (2014.01)
*H02S 20/10* (2014.01)
*H01L 31/0475* (2014.01)

(58) Field of Classification Search
CPC ......... H02S 20/00–20/32; H02S 30/00–30/20; H02S 40/00–40/44; H02S 50/00–50/15
USPC .................................................. 136/243–265
See application file for complete search history.

(56) References Cited

U.S. PATENT DOCUMENTS

| | | | | |
|---|---|---|---|---|
| 4,324,947 A | * | 4/1982 | Dumbeck | ............... F24S 80/20 |
| | | | | 136/248 |
| 4,597,377 A | * | 7/1986 | Melamed | ................... F24J 2/10 |
| | | | | 126/600 |
| 2010/0313933 A1 | | 12/2010 | Xu | |
| 2011/0023938 A1 | * | 2/2011 | Buchel | ................... H02S 20/32 |
| | | | | 136/246 |
| 2013/0312812 A1 | * | 11/2013 | Meyer | ................... F24J 2/5233 |
| | | | | 136/246 |

* cited by examiner

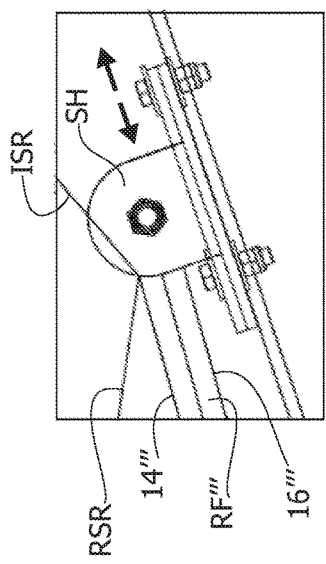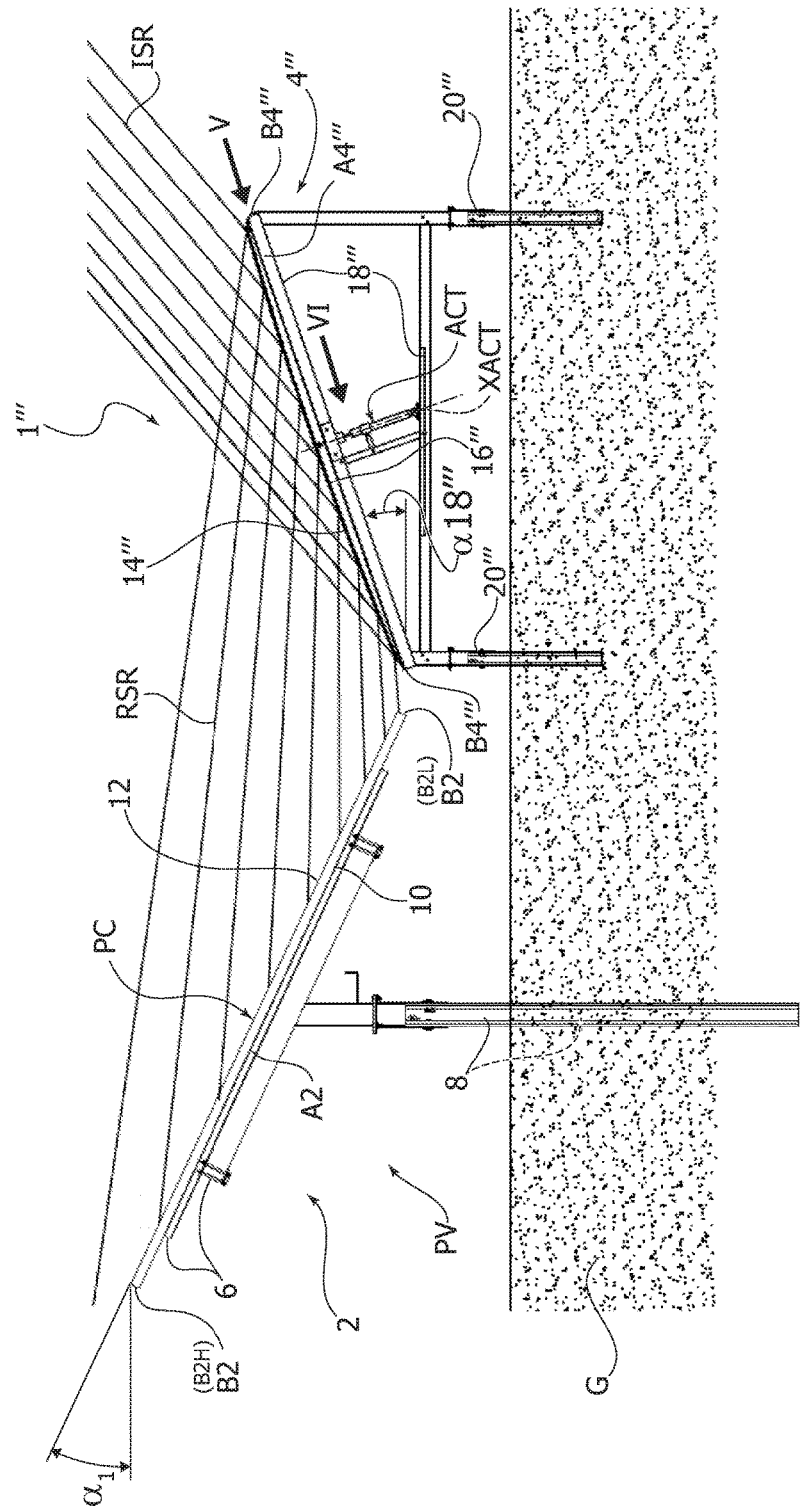

PHOTOVOLTAIC PLANT

BACKGROUND OF THE INVENTION

1. Technical Field

The present invention relates to photovoltaic plants.

2. Related Art

The technique of construction of photovoltaic plants commonly adopted envisages installation of a plurality of arrays of photovoltaic modules, each set with an assigned inclination with respect to a reference direction (for example, the horizontal or ground) so as to capture for the longest time possible solar radiation in a normal or practically normal direction. There may be envisaged solutions in which all the photovoltaic modules of one and the same array have the same assigned inclination or else have inclinations that differ to a varying extent in order to maximize absorption of energy from solar radiation.

Installation of the photovoltaic modules with an assigned inclination implies, however, that these are for the most part detached from the ground, with consequent generation of shadows of variable length according to the inclination of the solar rays. This imposes the need to arrange the arrays of photovoltaic modules envisaging wide free aisles between them in order to prevent the photovoltaic modules of one array from projecting their own shadow on the photovoltaic modules of the adjacent array, thus reducing the efficiency thereof and hence the productivity of the plant.

If on the one hand this enables minimization of the phenomenon of shading referred to above, on the other it entails a considerable disadvantage in terms of exploitation of the ground. In other words, pre-arrangement of wide free aisles between the arrays of photovoltaic modules drastically reduces the fraction of ground that can be used for installation of photovoltaic modules with respect to the overall surface of the ground on which the plant is installed, with evident economic disadvantages. In other words, a considerable fraction of the ground the fraction constituted by the aisles between the arrays is, in fact, not exploited and is unproductive in so far as it only has the purpose of receiving the shadows of the photovoltaic modules of an array.

SUMMARY OF THE INVENTION

The object of the invention is to solve the technical problems mentioned previously. In particular, the object of the invention is to provide a photovoltaic plant in which, albeit maintaining the conventional structure formed by arrays set at a distance so as to prevent problems of shading, the efficiency and productivity are considerably increased as compared to known photovoltaic plants.

The object of the invention is achieved by a photovoltaic plant having the features forming the subject of one or more of the appended claims, which form an integral part of the technical disclosure provided herein in relation to the invention.

In particular, the object of the invention is achieved by a photovoltaic plant including a plurality of photovoltaic modules arranged in arrays spaced with respect to each other, wherein the photovoltaic modules of each array have a first assigned inclination with respect to a reference direction, the photovoltaic plant being characterized:

in that associated to each array of photovoltaic modules is an array of mobile reflection devices set adjacent thereto, and wherein at least one array of mobile reflection devices is located in a space between successive arrays of photovoltaic modules;

in that the mobile reflection devices of each array have a second inclination with respect to a reference direction;

in that the arrays of photovoltaic modules and the arrays of mobile reflection devices associated to one another include respective front surfaces set facing one another; and in that the mobile reflection devices of each array are orientable by variation of said second inclination in order to intercept the incident solar radiation and reflect the latter towards the photovoltaic modules of the associated array.

THE DRAWINGS

The invention will now be described with reference to the annexed figures, which are provided purely by way of non-limiting example and in which:

FIG. 5 is a view similar to that of FIGS. 2, 3, and 4, but regarding yet a further embodiment; and FIG. 5A is an enlarged view of the detail indicated by the arrow V in FIG. 5.

DETAILED DESCRIPTION

Figure 1:
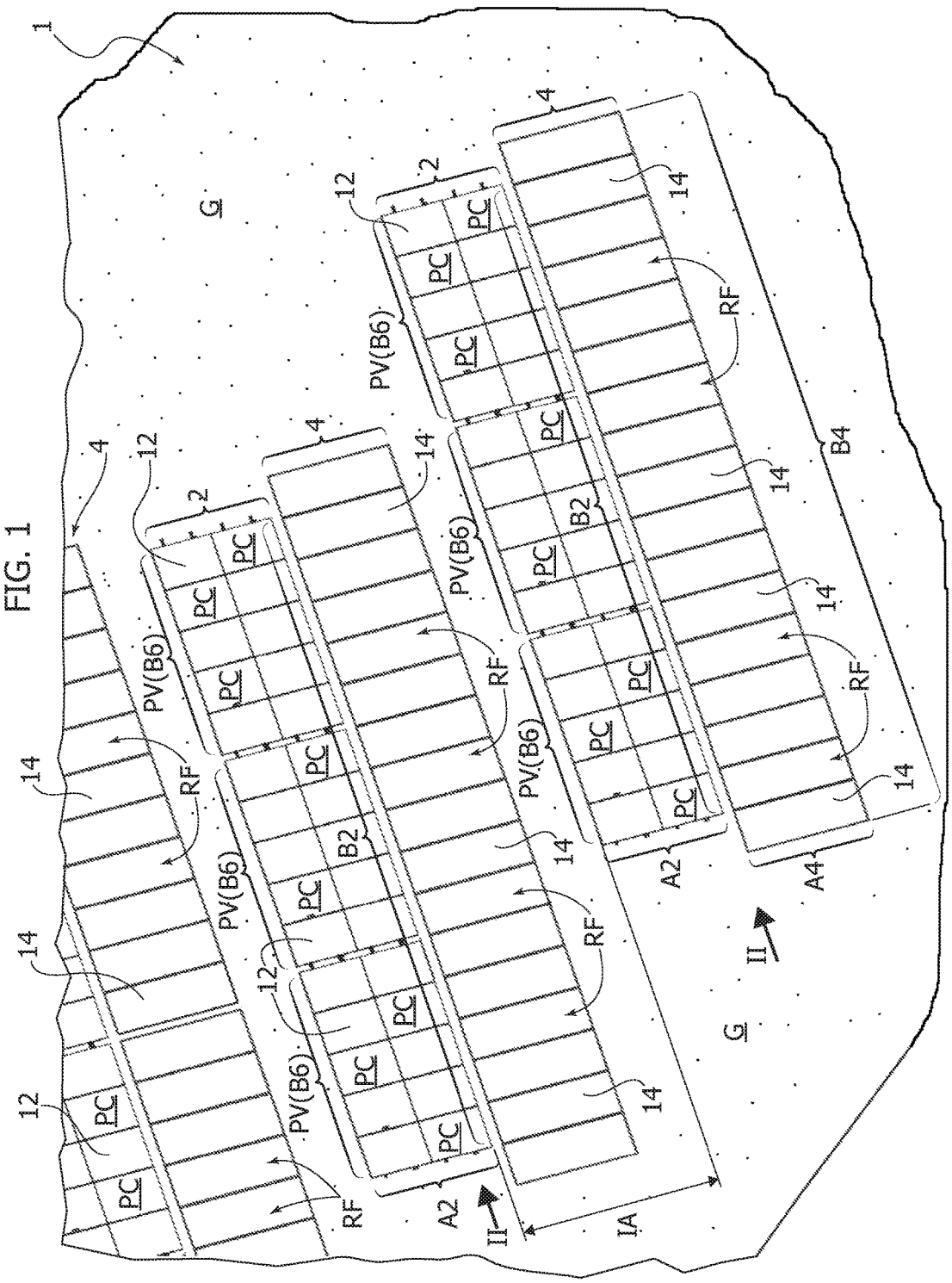
FIG. 1 is an aerial view of a photovoltaic plant according to the present invention.

In FIG. 1, the reference number 1 designates as a whole a photovoltaic plant according to various preferred embodiments of the invention.

The photovoltaic plant 1 includes a plurality of photovoltaic modules PV arranged in arrays 2 set at a distance from one another. The distance between the arrays is designated by the reference IA in FIG. 1. Associated to each array 2 is a corresponding array 4 of mobile reflection devices, each designated by the reference RF, which is set adjacent thereto. The arrays 4 are located in the space between two adjacent arrays 2. There may be the exception of some arrays 4 set in peripheral areas of the photovoltaic plant 1 (as may be seen in the bottom portion of FIG. 1), but in the plant 1 according to the invention at least one array 4 occupies the space between (two) successive arrays 2.

Figure 2:
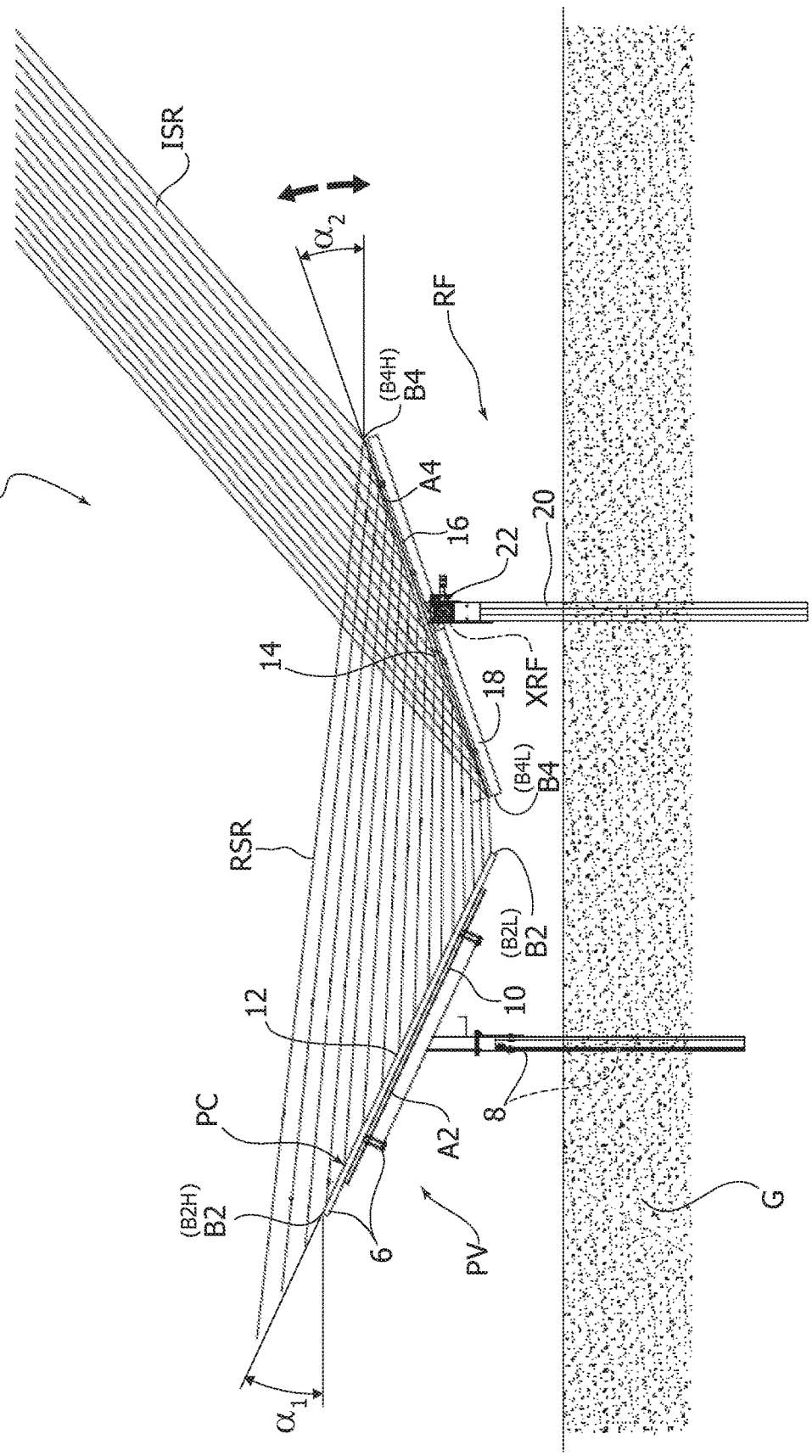
FIG. 2 is a view according to the arrow II of FIG. 1.

With reference to both FIGS. 1 and 2, each photovoltaic module PV includes a plurality of sets of photovoltaic cells, designated by the reference PC, joined together to constitute a photovoltaic panel of a rectangular shape. Each array 2 is hence constituted by a number of photovoltaic modules PV arranged side by side and preferably aligned (coplanar) with respect to one another. In this way, it is possible to identify, for the array 2, a pair of short sides A2 parallel to one another and a pair of long sides B2 parallel to one another and orthogonal to the short sides A2.

The photovoltaic panel is surrounded by and received in a perimetral frame 6 fixed to which, in particular to a dorsal surface 10 thereof, is a supporting post 8. The post 8 fixes and anchors the photovoltaic module PV to the ground G. Fixing of the perimetral frame 6 to the post 8 is provided so as to obtain an assigned inclination $\alpha_1$ (which is generally fixed) with respect to a reference direction, for example a horizontal direction (here the ground G is represented aligned to the horizontal so that the inclination $\alpha_1$ may also indifferently in this case be referred to the ground). The inclination $\alpha_1$ moreover coincides with the inclination of a front surface 12 of the photovoltaic module PV, on which the photovoltaic cells PC are arranged so as to intercept the solar radiation with an angle of incidence falling within an optimal range of values. The angle $\alpha_1$ is in general chosen in the range of values comprised between 0° and 90°.

Finally, it should be noted that the perimetral frame 6 of each photovoltaic module PV (hence, basically, the photovoltaic panel of the module PV) in turn includes two short sides parallel to one another (of a length identical to the side A2, in so far as they define in effect the latter) and two long sides B6 (appearing in brackets alongside the reference PV), parallel to one another and orthogonal to the short sides. Within each array 2 the photovoltaic modules PV are arranged so that the respective long sides B6 are substantially aligned to define the sides B2.

Each array 4 includes a plurality of plane mirrors that define the reflection devices RF. It is hence to be noted that by the term "mirror" is here meant in general an element provided with a reflecting surface (or, at the limit, the reflecting surface itself). This means that falling within this definition is a plurality of different devices, all having in common the property of reflecting light (in this case visible light). For this reason the mirrors RF may be made, for example, of materials such as silvered moulded glass (corresponding to the most conventional kind of mirror), the so-called "super mirror" steel, chrome-plated polymers, etc.

Each plane mirror RF includes a front reflecting surface 14 configured for reflecting solar light, and a dorsal surface 16, where fixing to a supporting frame 18 is envisaged. Fixed to the supporting frame 18 are one or more supporting posts 20 that anchor and fix the supporting frame 18, i.e., the plane mirrors RF, to the ground G.

In this connection, it should be noted that—in a way similar to the array 2—it is possible to identify for the array 4 a pair of short sides A4 parallel to one another and a pair of long sides B4 parallel to one another and orthogonal to the short sides A4. In a preferred embodiment, the supporting frame 18 extends so as to cover the entire length of the sides B4 (i.e., the entire extension of the array 4) and the plane mirrors RF are hence installed on the frame 18 side by side and substantially without solution of continuity. In this case, also a number of supporting posts 20 are provided coupled to the frame 18 given the considerable length thereof, typically of the order of tens of meters (17-20 m). The supporting post 20 is moreover just one of the possible examples of supporting structures for the frame 18: other embodiments may include, instead of the supporting post 20, surface ballasts made of slightly reinforced concrete fixed to which are supporting posts that are not mechanically driven into the ground. This solution is typical of installations in rocky terrains.

Moreover set at the interface between the support 20 and the dorsal surface 18 is an articulated joint 22 by means of which the plane mirrors RF are articulated with respect to the support 20 about a preferentially horizontal axis XRF. The system here illustrated envisages a uniaxial articulated joint, but it is possible, if the conformation of the ground were so to require, to envisage multi-axial articulated joints so as to guarantee an optimal positioning in any condition (further details will be provided in what follows).

Each supporting post 20 is connected to the supporting frame 18 by means of an articulated joint 22. The latter enables articulation of the frame 18 with respect to the post 20 about a horizontal axis XRF entering the plane of the drawing. Moreover possible are embodiments in which the plane mirrors RF are arranged in sets installed on independent frames 18, and each provided with its own supporting post (or posts) 20.

The articulated joint 22 is moved via a motor-reducer assembly integrated therein and operatively connected to an electronic control unit for its actuation. In this way, it is possible to govern a (controlled) oscillation movement of the frame 18 (and hence of the mirrors RF) about the axis XRF, whereby the mirrors RF are moved with respect to the ground G.

This means that, if $\alpha_2$ is the angle of inclination between the front surface 14 of the mirrors RF and a reference direction here assumed as coinciding with the horizontal (and, for what has been said previously, with the ground G), the angle $\alpha_2$ has a variable amplitude that can be controlled by means of the motor-reducer assembly integrated in the articulated joint 22.

In this embodiment, the articulated joint 22 is basically positioned in the median position between the long sides B4; however, embodiments are possible with axis of rotation off-centre and located at one of the long sides B4.

Each array 4 is set, with respect to the array 2 to which it is associated, so that the long sides B4 and B2 are substantially parallel to one another. Moreover, the long side B4 closer to the ground G is immediately adjacent to the long side B2 closer to the ground G.

It should be noted that, as a result of the inclination assigned to the photovoltaic modules PV and to the mirrors RF, there always exists in each array 2, 4 a difference of geometrical height of the respective long sides B2, B4 with respect to the ground G: the side B2 (or B4) of each array 2 (or 4) closer to the ground will hence be the one having a smaller geometrical height (i.e., a smaller distance) from the ground and is designated, in brackets, by the reference B2L (or B4L). Logically, the side B2 (or B4) further away from the ground will be the one at a greater geometrical height/distance from the ground itself, and is designated; in brackets, by the reference B2H (or B4H).

In other words, whatever the variation imposed on the angle $\alpha_2$, it must fall in a range such that the front surface 14 of the mirrors RF is at least partially in view of the front surface 12 of the photovoltaic modules PV, defining (see in this connection the view of FIG. 2) a substantially V-shaped geometry of the ensemble constituted by an array 2 and an array 4 associated thereto. The reasons for this will emerge more clearly in what follows.

Operation of the photovoltaic plant 1 is described hereinafter.

With reference to FIG. 2, the incident solar radiation designated by the reference ISR strikes the photovoltaic plant 1 impinging both upon the photovoltaic modules PV and upon the mobile reflection devices RF. When the incident solar radiation ISR strikes the mirrors RF, these reflect it towards the photovoltaic modules PV. The reflected radiation is designated by the reference RSR. This renders evident the reason why the front surfaces 14 and 12 must face one another: this is necessary so that the reflected solar radiation RSR will strike the photovoltaic cells on the front surface 12 of the photovoltaic modules PV.

If this were not so, reflection of the solar radiation obtained with the mirrors RF would impinge totally or in part on areas different from the front surface 12, where no useful effect would be produced.

Moreover stored in the electronic control unit that controls the articulated joint 22 is an algorithm conceived for computing and selecting the values of the angle $\alpha_2$ so as to optimize the angle of incidence of the reflected solar radiation RSR on the photovoltaic modules PV (i.e., on the solar panels that constitute them).

The algorithm moreover operates having as input variables the date (i.e., it takes into account the period of the year) and time of day, as well as statistical information on the angles of incidence of the solar radiation with respect to the horizon in the geographical region where the plant 1 is installed. In greater detail, the articulated joint 22 is controlled by an algorithm that performs a double check. The stored value of the angle $\alpha_2$, which represents a pre-calculated optimal theoretical value of inclination for each month, day, and time, is compared, within each characteristic time interval $t_{step}$ of the control algorithm (which hence develops over a sequence of intervals of duration $t_{step}$), with a value calculated as a function of the following input variables:

i) intensity of the incident solar radiation;
ii) string current;
iii) height of the Sun;
iv) direction and intensity of the wind;
v) inclination of the structure (in particular this is the absolute inclination of the structure with respect to the vertical in the time interval $t_{step}$ in which the system reads the variables; except for a constant value determined by the morphology of the ground, the inclination will be equal to $\alpha_2$).

There then exists the possibility of correcting the pre-set value of $\alpha_2$ with the value determined via the algorithm for control of the articulated joint 22 in the case where the operating conditions of the plant impose such a choice. It is in any case envisaged to program the control algorithms based on a greater or smaller number of variables (in the limit only one of the ones above listed) as a function of the characteristics of the installation site.

In particular, if statistically it is shown that one or more of the aforementioned variables have a practically constant evolution in time in a given site of installation of the photovoltaic plant, it is possible to simplify the algorithm eliminating the functional dependence upon the aforesaid one or more variables.

Instead, if the five variables listed above are not sufficient to constitute a computing model that is able to describe fully the variability of the conditions that regard a certain installation site, it is possible to add further variables or replace one or more of the variables i)-v) with one or more variables that describe in a better way evolution of the system in which the photovoltaic plant 1 operates.

In this way, there is defined a method for orientation of the array 4 of mobile reflection devices that comprises:
a first step of detection, within the framework of a time interval having a predetermined duration $t_{step}$, of the values of one or more physical quantities which are representative of operative conditions of an installation site of the photovoltaic plant,
a second step of calculation, within the framework of the time interval $t_{step}$, of an inclination value $\alpha_2$ of the array 4 as a function of the detected value of the one or more aforesaid physical quantities,
a third step of comparison of the calculated inclination value $\alpha_2$ with a theoretical and pre-calculated optimal inclination value,
a fourth step of correction of the pre-calculated theoretical optimal inclination value with the calculated inclination value $\alpha_2$, wherein the first, the second, the third and the fourth steps are repeated along a sequence of time intervals having a predetermined duration $t_{step}$.

It should be noted that, notwithstanding the fact that the value of angle $\alpha_2$ is updated periodically via the calculation carried out by the algorithm referred to above, having in any case an optimal theoretical value of the angle $\alpha_2$ pre-calculated and stored affords multiple advantages:

a) it accelerates the processes of search for the maximum, i.e., for the highest energy efficiency of the plant: the value stored constitutes a starting value around which the value of angle $\alpha_2$ that corresponds to the condition of highest desired efficiency will probably (but not necessarily—consider, for example, variable operating conditions or operating conditions different from the expected ones) fall;

b) on days with marked variability of weather conditions, it prevents the system from encountering difficulties on account of the imbalance between the time constants typical of the search for the optimal value of $\alpha_2$ and the time intervals in which a variation of the boundary conditions occurs, which will be decidedly shorter than the aforesaid time constants; and c) in the event of failure of one or more sensors, it prevents faulty positioning of the reflection devices of the array 4, which may project shadows on the modules FV.

It should moreover be noted that the duration $t_{step}$ can be assumed as fixed or variable as a function of the conditions of the installation site itself.

The variables i) to v) (but this applies in general, whatever the number of variables that intervene in the algorithm) are detected via corresponding sensors. The ensemble of the sensors used for detection of the physical quantities associated to the above variables constitutes a modular sensor system with which the photovoltaic plant 1 is equipped.

The number of the aforesaid sensor systems varies in a way directly proportional to the irregularity of the ground in which the plant is installed. In other words, in the case of a perfectly plane terrain, the sensor system equips a single array 4 of reflection devices, since the value of $\alpha_2$—whether it is pre-calculated or calculated via the algorithm described—may be deemed applicable to all the arrays 4. In the case where the ground is markedly irregular, application of a uniform value of $\alpha_2$ is not generally an option that can be pursued, and it is consequently necessary to equip all the arrays 4 with a dedicated sensor system (or else it is possible to divide the arrays 4 into sets according to their location on portions of ground having locally uniform characteristics and equip with the sensor system just one array 4 in each set).

The control unit is hence configured for sending an actuation signal to the motor-reducer assembly integrated in the articulated joint 22 so as to set the value of $\alpha_2$ calculated via the aforesaid algorithm. This of course can be repeated for any number of iterations each time there is an updating, by the algorithm, of the angle $\alpha_2$ as time passes. In this way, the orientation of the array 4 of mirrors RF is varied with the aim of maximizing the amount of energy of the reflected radiation RSR transferred to the solar panels of the modules PV of the array 2. The angle $\alpha_2$ typically falls in the range 0° and 90°. The choice of the values in this range, as will be appreciated, is always and in any case linked to the morphology of the terrain.

Finally, in some cases, in particular where the morphology of the terrain on which the photovoltaic plant 1 is installed is exceptionally irregular, the inventors have noted that it is convenient at—the limit—to do without the sensors, allowing the system to follow just the pre-stored data for the angle $\alpha_2$.

It is hence evident how, albeit maintaining the same basic setting of the photovoltaic plants of a known type (wide aisles between the arrays 2 that prevent mutual shading), the photovoltaic plant 1 makes it possible to obtain considerable increase in productivity as compared to photovoltaic plants of a known type in so far as the solar radiation that in known plants would impinge on non-productive areas—i.e., the aisles between the arrays 2—in this case impinges upon the mobile reflection devices, which are set precisely in the aisles between the arrays 2.

In this way, albeit minimizing the effects of mutual shading by maintaining the arrays 2 of photovoltaic modules PV at a due distance, the unexploited fraction of the ground on which the photovoltaic plant 1 is installed is reduced thanks to the association of an array 4 of mobile reflection devices to each array 2 of photovoltaic modules, thus recovering a considerable amount of energy that would otherwise be dispersed.

Of course, the embodiments and the details of construction may vary widely with respect to what is described and illustrated herein, without thereby departing from the scope of the present invention, as defined by the annexed claims.

For instance, it is possible to envisage embodiments in which according, for example, to the need for installation in lots of land having a profile that to a certain extent is irregular, the articulated joint 22 is of a multi-axial (for example, biaxial) type so as to enable an optimal orientation of the mirrors RF with respect to the solar panels of the array 2.

Figure 3:
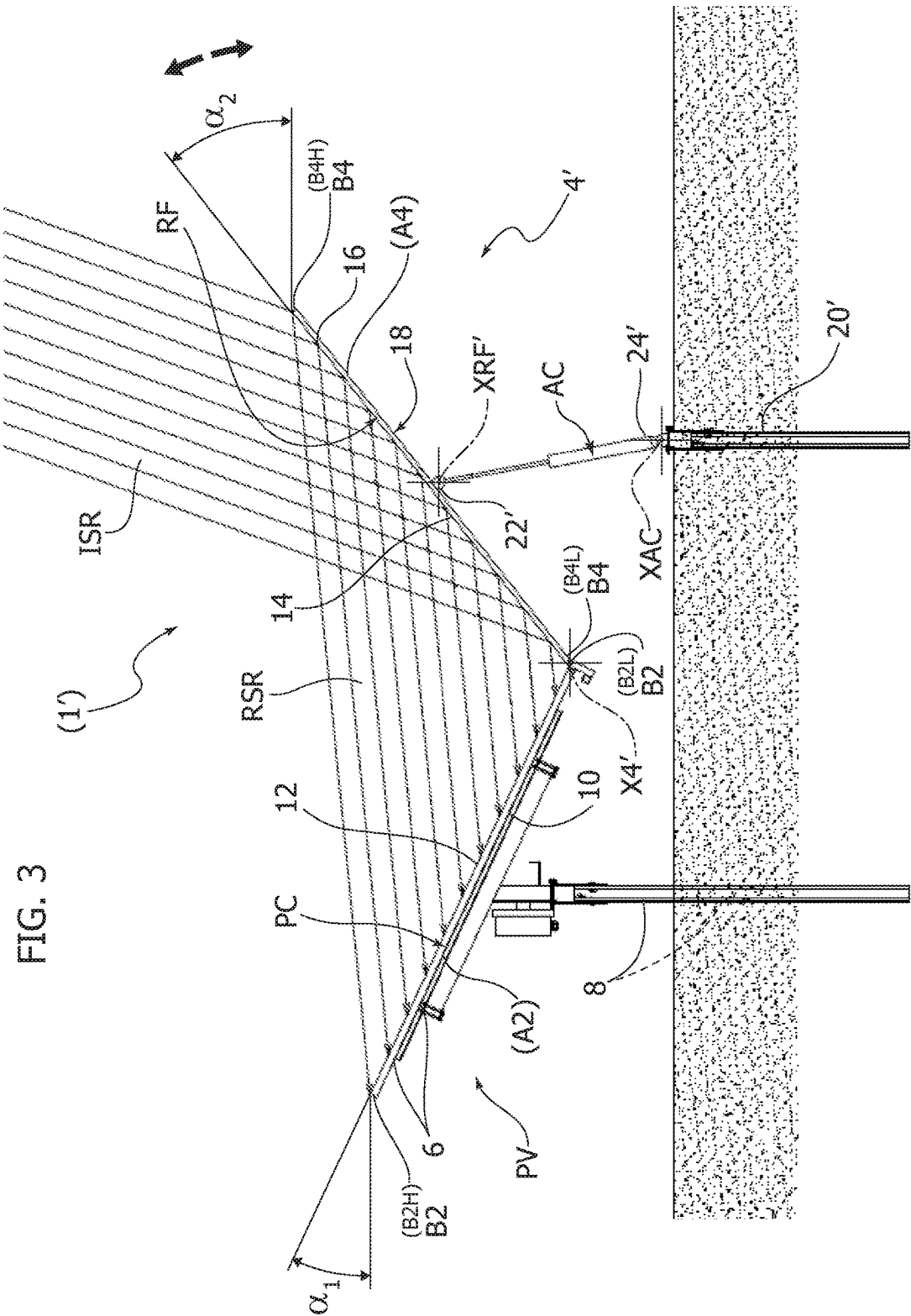
FIG. 3 is a view similar to that of FIG. 2 but regarding a further embodiment of the invention.

In this connection, reference may be made to FIG. 3, where a further embodiment of a photovoltaic plant according to the invention is designated by the reference number 1'. The components that are identical or substantially similar to those already described are designated by the same references. For this reason, the description already developed as regards the plant 1 also applies to the plant 1', except for the portions thereof that are manifestly incompatible.

The photovoltaic plant 1' differs from the plant 1 basically in the scheme of constraint and in the modalities of orientation of the structure of the array 4 of mobile reflection devices, which are here designated by the reference number 4' and are once again located in the space comprised between arrays 2 of successive photovoltaic modules (where this is possible—in general, the plant 1' comprises at least one array 4' located between successive arrays 2).

In particular, the frame 18 of the array 4', which supports the reflection devices RF, is articulated to the associated array 2 of photovoltaic modules at the respective long sides B2, B4 of each of the arrays 2, 4'. The reference X4' designates the axis of articulation between the two arrays 2, 4'.

The frame 18 is connected to a supporting structure 20', which anchors and fixes the array 4' to the ground, by means of a linear actuator AC. In particular, the linear actuator AC includes a first end articulated at a hinge 22' (that replaces the articulated joint 22) about an axis XRF'. A second end of the linear actuator AC is, instead, articulated to the post 20' about an axis XAC by means of a hinge 24'. Preferably (as in the example of the figures), the axis XAC is located in the proximity of the ground at the exposed end of the post 20'. The axes X4', XRF' and)(AC are all parallel to one another.

In this way, there is defined a three-hinge mechanism, which includes two fixed hinges with axes)(AC and X4' and a mobile hinge with axis XRF'. The angle $\alpha_2$ is modulated (on the basis of the criteria and the algorithm described) via variation of the position of the axis XRF' in space. This is possible by controlling a retraction or extraction of the stem of the actuator AC, which results in a decrease or an increase of the distance between the axes XAC and XRF' (the distance between the axes XRF' and X4' is constant) and a consequent variation of position of the supporting structure that carries the reflection devices XRF. This is also accompanied by a variation of position of the actuator XAC, which is possible thanks to the double articulated joint thereof. In a way similar to what has been described for the plant 1, whatever the variation imposed on the angle $\alpha_2$, it must fall in a range such that the front surface 14 of the mirrors RF is at least partially in view of the front surface 12 of the photovoltaic modules PV, defining (FIG. 3) a substantially V-shaped geometry of the ensemble constituted by an array 2 and an array 4' associated thereto.

For this purpose, the actuator AC is operatively connected to an electronic control unit in which the algorithm of calculation of the angle $\alpha_2$ is implemented.

The actuator AC is preferably of the electromechanical type, which can be controlled more easily and is such as to require pre-arrangement less auxiliary equipment as compared to a hydraulic or pneumatic actuator (which, instead, require a dedicated circuit on which a control must in turn be implemented that will enable modulation of the angle $\alpha_2$). This, however, does not rule out the possibility of envisaging in some variants pneumatic or hydraulic actuation.

The photovoltaic plant 1', and in particular the system for fixing the array 4' to the ground and to the array 2, are expressly conceived for installation on markedly irregular terrain, where it would be disadvantageous to apply the structure of the plant 1.

Figure 4:
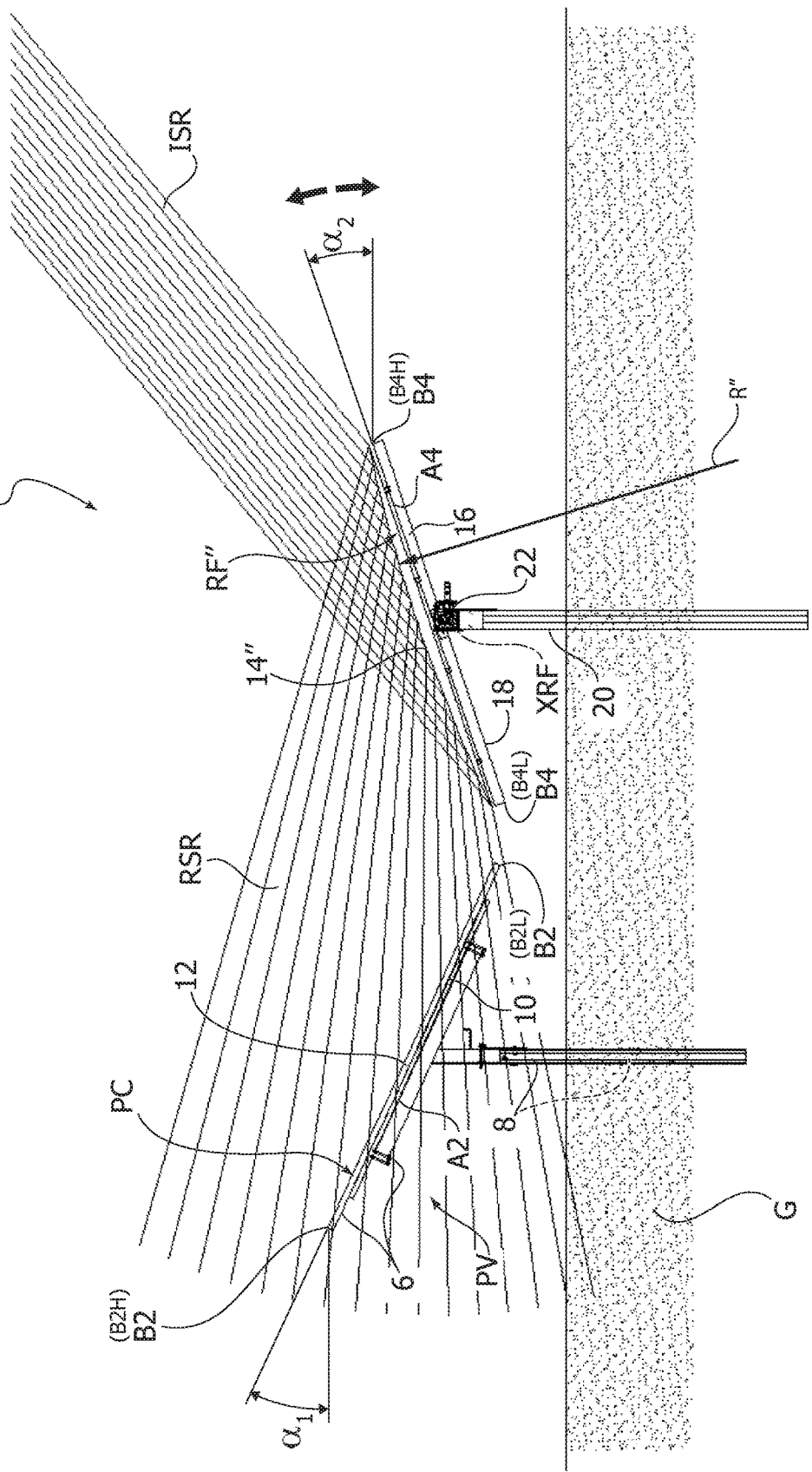
FIG. 4 is a view similar to that of FIGS. 2 and 3 but regarding yet a further embodiment.

Reference may now be made to FIG. 4, which illustrates a further advantageous embodiment of a photovoltaic plant according to the invention designated by the reference number 1", and basically configured as a variant of the plant 1 illustrated in FIGS. 1 and 2. Components that are identical to those previously described are designated by the same references, and all the considerations already set forth in relation to the plants 1, 1' apply—where not manifestly incompatible also to the plant 1". The plant 1" is substantially similar to the plant 1, except for the mobile reflection devices, designated by the reference RF", which include a plurality of convex mirrors having a front reflecting surface 14" that has a curvature along a directrix parallel to the short sides A4 and orthogonal to the long sides B4 (see in this connection the side view of FIG. 4). The radius of curvature of the surface 14, designated by R" in FIG. 4, has different values, calculated each time, that are a function of the distance of the reflecting surface from the array of modules and from the orography of the terrain where the plant is installed.

Also in this case, the front reflecting surface 14" of the array 4 faces the front surface 12 of the array 2, bestowing on the two arrays 2, 4 an arrangement with a substantially V-shaped geometry. Concerning operation, the incident solar radiation ISR impinges on the reflecting surface 14", which reflects the solar rays in a substantially divergent beam that defines the reflected solar radiation RSR.

The shape of the mirrors RF makes it possible to obtain a dual advantage:

i) in the first place, the ranges of regulation of the system (i.e., the ranges of variation of the angle $\alpha_2$) may be extended in so far as the divergence of the beam of the reflected solar radiation RSR enables the latter to impinge upon an area of larger extent than that of the photovoltaic modules; in other words—as compared to what happens in the case of the plant 2—the photovoltaic modules of the array 2 will in any case be impinged upon by the radiation RSR for a more extensive fraction of the solar path without this requiring any correction of the angle $α_2$; and ii) the times of partial shadow, which especially in winter months, when the Sun is very low above the horizon, penalize the performance of the system, are eliminated.

It should moreover be borne in mind that it is possible to envisage embodiments in which convex mirrors RF'' are used in the plant 1' (illustrated in FIG. 3) instead of the plane mirrors RF, with advantages similar to the ones just described.

Figure 6A:
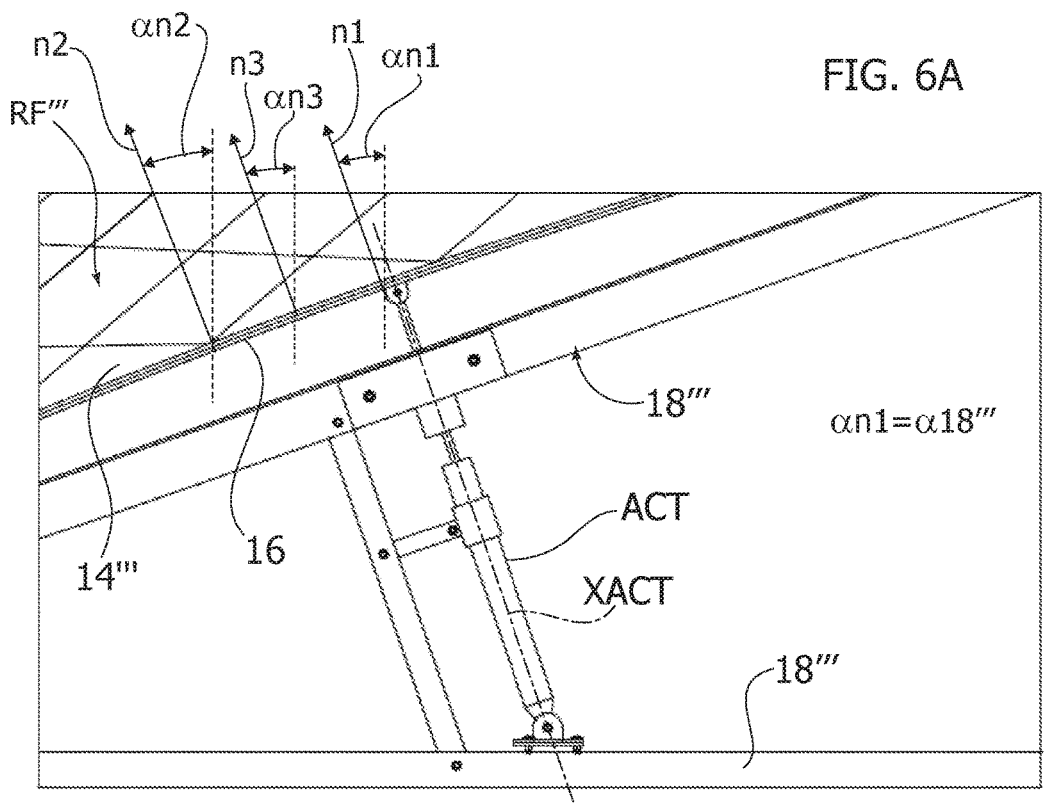
FIGS. 6A and 6B are enlarged views of a detail indicated by the arrow VI in FIG. 5 and corresponding to two different operating conditions.
Figure 6B:
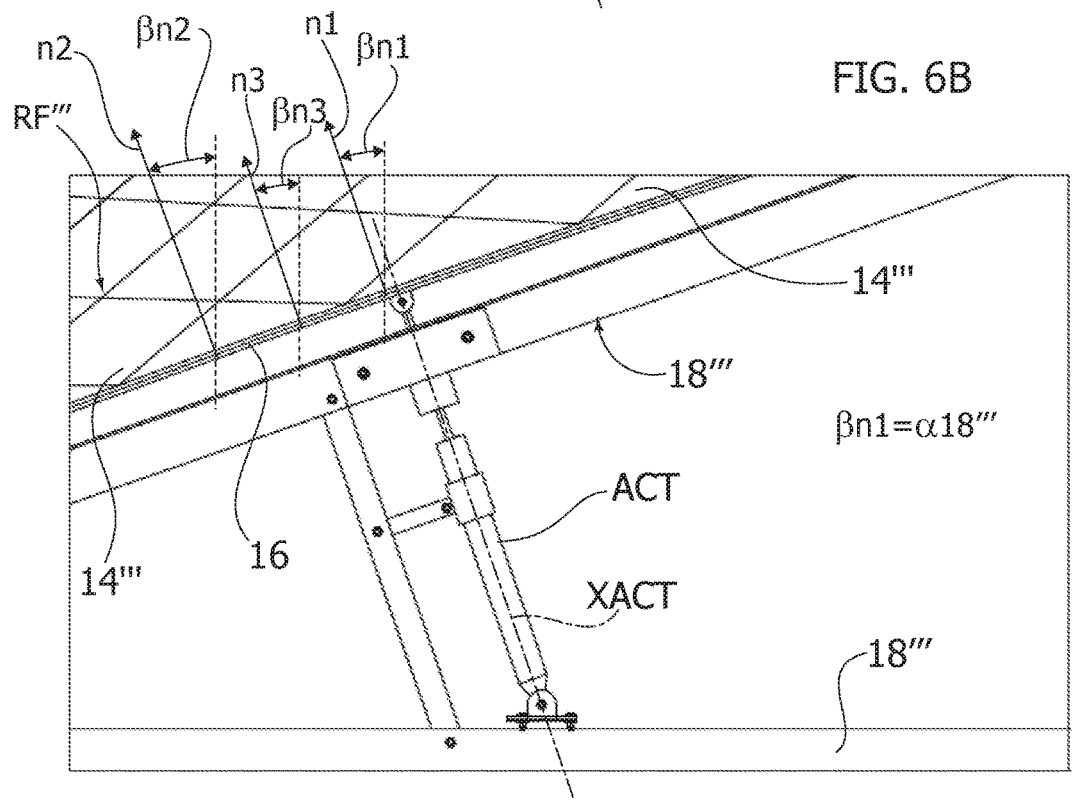

Finally, with reference to FIG. 5, as well as to FIGS. 6A-6B, yet a further embodiment of a photovoltaic plant according to the invention is designated by the reference number 1'''. The components that are identical to those previously described are designated by the same references, and all the considerations already set forth in relation to the plants 1, 1', 1'' apply where they are not manifestly incompatible also to the plant 1'''. The plant 1''' is substantially similar to the plant 1, except for the array of mobile reflection devices, here designated by the reference 4'''.

In particular, the array 4''' differs from what has so far been described and illustrated as regards the mobile reflection devices (here designated by the reference RF''') and as regards the supporting frame (here designated by the reference 18'''). In this embodiment, unlike the others, the reflection devices RF''' are obtained using deformable sheets of reflecting material, for example, thin panels of metal material (like sheet metal). Alternatively, the reflection devices RF''' are obtained using sheets of reflecting plastic material. The devices RF''' will hence be referred to in the ensuing description by the term "deformable mirrors" (for the meaning of "mirror", reference may be made to the foregoing description).

Moreover, the frame 18''' bearing the reflection devices RF''' is fixed and without articulations with respect to the ground (unlike the case of the photovoltaic plants 1, 1', 1''). In this connection, the frame 18''' has a static inclination designated by the reference al 8''' with respect to the horizontal.

Each deformable mirror RF''' includes a front reflecting surface 14''' configured for reflecting the sunlight, and a dorsal surface 16''', where fixing to the supporting frame 18''' is obtained by an actuator assembly ACT and a plurality of sliding hinges SH. In this embodiment, the supporting frame 18''' includes two rows of supporting posts 20''' that anchor and fix the supporting frame 18''' and the plane mirrors RF''' to the ground G.

In this connection, it should be noted that also for the array 4''' with deformable mirrors RF''' it is possible to identify a pair of short sides A4''' parallel to one another and a pair of long sides B4''' parallel to one another and orthogonal to the short sides A4'''.

Each array 4''' is set, with respect to the associated array 2, so that the respective long sides B4''', B2 are substantially parallel to one another and so that the long side B4''' of the array 4''' closer to the ground G is immediately adjacent to the long side B2 of the array 2 closer to the ground G (the side B2L), so that each array 2 and the array 4''' of associated mobile reflection devices are set in a V shape. In a preferred embodiment, the supporting frame 18''' extends so as to cover the entire length of the sides B4''' (i.e., the entire extension of the array 4'''), and the deformable mirrors RF''' are then installed on the frame 18''' set side by side and substantially without solution of continuity. In this case, also a number of supporting posts 20''' are provided in the direction of the length of the array 4''' given the considerable development thereof, which is typically of the order of tens of meters (17-20 m).

The actuator assembly ACT includes a linear actuator (electromechanical actuator, pneumatic actuator, or hydraulic actuator according to the need) having a stem mobile along a longitudinal axis) (ACT of the actuator ACT. The actuator ACT is governed by means of a control system, the operating logic of which will be described in the ensuing paragraphs.

The actuator assembly ACT includes a first end hinged to the frame 18''' and a second end hinged to the dorsal surface 16''' of the corresponding deformable mirror RF''', and in particular hinged at the geometrical centre of the surface itself.

In an undeformed configuration (i.e., in a completely plane configuration) each mirror RF''' has all the normals to the reflecting surface 14''' oriented parallel to one another and describing the angle $α18'''$ with respect to the vertical.

The orientation of the mirrors RF''' is varied thanks to the deformability of the mirrors themselves. In particular, each actuator assembly ACT is able to vary the distance of the dorsal surface 16''' from the supporting frame 18''': given that it acts at the geometrical centre of the deformable mirror RF''', the result is that of a variation of concavity of the mirror RF''' itself.

The variation of orientation lies in the fact that to each variation of concavity of the deformable mirrors RF''' there corresponds a variation of the orientation of the normals to the surface 14'''. Reference may be made for this purpose to FIGS. 6A and 6B, which illustrate two different positions of the actuator ACT corresponding to two different curvatures imparted on the layer RF''' and, consequently, to two different orientations of the normals to the surface 14'''.

By way of example, three straight lines normal to the surface 14''' have been drawn (in the figure, for convenience, the corresponding vectors are represented) choosing three points representing the surface: the geometrical centre and two points around it. The three normals are designated by the references n1 (normal in the geometrical centre), and n2 and n3 (normals in lateral points with respect to the geometrical centre), and for each of them the angle described with respect to the vertical, respectively $αn1$, $αn2$, $αn3$, is indicated. The normals n1, n2, n3 in effect define the straight lines normal to the planes tangential to the surface 14''' in the points indicated above.

In the condition illustrated in FIG. 6A, which corresponds to a situation where the concavity of the deformable mirror RF''' is very marked, the angles $αn2$, $αn3$ assume greater values than the angle $αn1$, which, given that it is at the geometrical centre (as well as on the straight line of action of the actuator assembly ACT), always equal remains to the value $α18'''$. The amplitude of the angles described by the normals to the surface 14''' with respect to the vertical in general increases proceeding from the centre towards the periphery of the deformable mirror RF'''.

In the condition illustrated in FIG. 6B, the concavity is less marked as compared to the condition of FIG. 6A (it will be appreciated that the distance between the surface 16''' and the frame 18''' is smaller), and the normals n2 and n3 consequently describe angles $βn2$, $βn3$ smaller than the angles $αn2$, $αn3$, but in any case wider than the angle $βn1$, which is always equal to $α18'''$. The distribution of the amplitudes of the angles described by the normals to the planes tangential in each point to the surface 14''' is the same as the one already described above. The deformations imposed on each deformable mirror RF''' by the actuator assembly ACT are moreover such as to result in a displacement of the ends each deformable mirror RF''' in the direction of the short side A4. This displacement is allowed thanks to the sliding hinges SH, which are fixed at the four vertices of each deformable mirror RF''' (which has a quadrangular shape) and along the sides of the mirror RF''' parallel to the long sides B4''', so as to ensure that the curvature imparted on the deformable mirrors RF''' by the actuator assembly ACT belongs to a single plane (the plane of the drawing, in the example illustrated in the figures). Moreover, the hinges SH are mounted on the frame 18''' so that they slide in a direction parallel to the short sides A4''' of the array 4''' by means of rails fixed to the frame 18''' and set parallel to the short sides A4'''.

Preferably, the hinges SH are provided on brackets of a length equal to that of the sides B4''' set on the same sides, where these brackets are mobile along the rails parallel to the short sides A4''' (the rails can of course be set also on the sides A4''' themselves).

Once again preferably, the cross section chosen for the aforesaid brackets is square. In any case, the cross section of the brackets may also have a different shape, according to the requirements.

Variation of the concavity of the deformable mirrors RF''', with consequent reconfiguration of the normals to the planes tangential to the surface 14''', enables modulation of the amplitude of the reflected beam of light RSR so that the latter strikes the surface of the photovoltaic modules PV whatever the angle of incidence of the solar radiation ISR. In addition, there exists the possibility of driving in a differentiated way the sets of actuators ACT of each array 4''', hence varying the concavity of the mirrors RF''' in a way equally differentiated along the array 4'''.

As regards the method of regulation of the concavity of the deformable mirrors RF''', the control system that drives the actuator ACT includes an algorithm that envisages imposing successive variations searching for the optimal value of stroke of the actuator ACT, i.e., a value of stroke of the mobile element of the actuator ACT that imparts on the mirrors RF''' a concavity such that the entire capturing surface of the modules FV will be impinged upon by the reflected radiation RSR.

In particular, the algorithm carries out a search for the operating point—i.e., the aforesaid optimal stroke of the actuator ACT—proceeding by small increments and decrements of the stroke of the actuator, corresponding to small increments and decrements of the value of the concavity. In other words, movements of the actuator ACT in opposite directions are controlled by extraction-retraction of a stem or slider as a function of the type of (linear) actuator ACT used.

The amplitude of each actuation may be such as to cancel the effects of the immediately preceding actuation or actuations for example, in the case where it is found that actuation in one direction does not lead to an optimal operating condition—or else may have a value lower or much lower than that of the immediately preceding actuation—for example, in the case where the operating conditions are close to the optimal conditions, and only minor adjustments are necessary with respect to the condition reached after an actuation of larger extent (or after a series of successive actuations in the same direction of a smaller extent, even imparted in a continuous way).

The iterative process proceeds until the optimal value of concavity is identified (corresponding to the optimal value of stroke).

In order to implement this method, a continuous measurement is made of the value of radiation in the proximity of the long side B2 of the capturing surface (i.e., the surface 12 of the modules PV), thereby meaning both the higher side (B2H) and the lower side (B2L).

By so doing, thanks to the successive iterations, the value of concavity will be identified such as to enable the peripheral reflected rays RSR (those with angle of reflection of a larger value) to fall in the proximity of (in the limit, in a point corresponding to) the upper and lower limits of the capturing surface (surface 12 of the modules PV), i.e., in the proximity of (in the limit, in a point corresponding to) the long sides B2H and B2L.

The algorithm operates on the basis of a reference value of intensity of radiation, which corresponds to the value of the intensity of the radiation incident on the surface of the modules PV in the absence of a reflection system, i.e., in the absence of radiation reflected by the array 4. This radiation corresponds to the fraction of radiation ISR that in any case impinges upon the photovoltaic modules PV The method of variation of the concavity envisages simultaneous detection of the intensities of the "basic" radiation (ISR) and of the "optimized" radiation (incident radiation ISR and reflected radiation RSR) at each of the two long sides B2H, B2L.

During search for the operating point (i.e., for the optimal concavity of the deformable mirror RF'''/optimal stroke of the actuator ACT) there are detected the increments and decrements of the sum of the intensities of the "basic" radiation (namely, the incident radiation ISR alone, which would impinge in any case upon the modules PV) and the reflected radiation RSR both along the high side B2H and along the low side B2L.

The value of the above sum (which corresponds to the intensity detected along the sides B2H and B2L) varies between two limit values; namely, a lower-limit value, equal to the value of intensity of the "basic" radiation, hence the value of intensity of the incident radiation ISR at the respective long side B2H, B2L;

an upper-limit value, which corresponds to the maximum value of intensity of the solar radiation that can be detected (and is detected) at the respective long side B2H, B2L in the current condition of irradiation of the photovoltaic plant (in general in a given condition of irradiation); the upper-limit value hence comprises, in addition to the value of intensity of the "basic" radiation (ISR) at the respective long side B2H, B2L, the maximum value of intensity of the reflected radiation RSR that can be detected at the respective long side B2H, B2L; this maximum value is in general specific for each side B2H, B2L and may differ according to the different height of the sides B2H, B2L; in certain conditions, however, the difference between the two maximum values (one for the side B2H and one for the side B2L) may be so small that it is possible to assume an identical maximum value for both of the sides, thus simplifying and optimizing the calculation.

The system that drives the actuator ACT and receives the signals from the sensors that detect the intensity of the solar radiation along the sides B2H, B2L, by virtue of what has been described above, will see an increase in the value of the sum of intensities of the "basic" radiation (ISR) and of the reflected radiation (RSR). Driving of the actuator ACT is stopped when the value of the sum returns to the base value (in other words when the extra contribution of radiation present in the sum, due to the radiation RSR, is seen to vanish). It is clear that, according to the direction of actuation of the actuator ACT, there will be a "high-to-low" or "low-to-high" sequence in the zeroing of the extra contribution of radiation present in the sum.

In either case, the system will act on the actuator ACT so as to bring the concavity of the deformable mirror RF''' to the value that restores the extra contribution (due to the radiation RSR) at both sides, automatically ensuring that this contribution is as high as possible.

In summary, a method for variation of the concavity of the array 4''' is thus implemented, comprising the steps of:
  detecting the intensity of the solar radiation (both the incident radiation ISR and the reflected radiation RSR, if present) at each of the two long sides B2H, B2L of the associated array 2 of photovoltaic modules PV; and
  governing a movement of the actuator assembly ACT in order to produce a variation of concavity of the mobile reflection devices RF''' as a function of the detected intensity of the solar radiation,
  wherein the step of governing a movement of the actuator assembly
  ACT is iterated until a concavity is identified such that the values of intensity of the solar radiation at each of the two long sides B2H, B2L are equal to maximum values for the respective side B2H, B2L.

This is substantially equivalent to associating the optimal operating point of the array 4''' (hence, the optimal concavity of the deformable mirrors RF''' and the optimal stroke of the actuator ACT) to a condition where the peripheral rays of the reflected solar radiation RSR are in the proximity of the long sides B2H, B2L of the associated array 2 of photovoltaic modules PV.

The invention claimed is:

1. A photovoltaic plant including a plurality of photovoltaic modules arranged in arrays spaced with respect to each other, and wherein the photovoltaic modules of each array have a first assigned inclination with respect to a reference direction, wherein associated to each array of photovoltaic modules is an array of mobile reflection devices set adjacent thereto, and wherein at least one array of mobile reflection devices is located in a space between successive arrays of photovoltaic modules;
  wherein the mobile reflection devices of each array have a second inclination with respect to a reference direction; in that the arrays of photovoltaic modules and the arrays of mobile reflection devices associated to one another include respective front surfaces set facing one another;
  wherein the mobile reflection devices of each array are orientable by variation of said second inclination in order to intercept incident solar radiation and reflect the interrupted incident solar radiation towards the photovoltaic modules of the associated array;
  wherein each array of mobile reflection devices includes a plurality of deformable mirrors installed on a supporting frame having a fixed inclination with respect to the ground, and wherein associated to each of said mobile mirrors is an actuator assembly configured for causing a deformation thereof that modifies a concavity thereof;
  wherein each actuator assembly includes a linear actuator having a first end hinged to the supporting frame and a second end hinged to a dorsal surface of the corresponding deformable mirror; and
  wherein each deformable mirror is moreover fixed to said supporting frame by means of a plurality of sliding hinges, wherein each sliding hinge is mobile in a direction parallel to a short side of said array of mobile reflection devices.

2. The photovoltaic plant according to claim 1, wherein each array includes two respective short sides parallel to one another and two respective long sides parallel to one another and orthogonal to the corresponding short sides, each array of mobile reflection devices being set, with respect to the associated array of photovoltaic modules, so that the respective long sides are substantially parallel to one another and so that the long side of the array of mobile reflection devices closer to the ground is immediately adjacent to the long side of the array of photovoltaic modules closer to the ground.

3. The photovoltaic plant According to claim 1, wherein each array of photovoltaic modules and the array of associated mobile reflection devices are set in a V shape.

4. The photovoltaic plant according to claim 1, wherein each array of mobile reflection devices includes a plurality of mirrors installed on a frame articulated with respect to a supporting structure that anchors and fixes the array to the ground.

5. The photovoltaic plant according to claim 4, wherein said plurality of mirrors includes one of the following types:
  plane mirrors; and
  convex mirrors.

6. The photovoltaic plant according to claim 4, wherein said frame is connected to said supporting structure by means of an articulated joint integrating a motor-reducer assembly operatively connected to an electronic control unit, wherein said electronic control unit is configured for driving said motor-reducer assembly so as to vary the orientation of said mirrors.

7. The photovoltaic plant according to claim 4, wherein said frame is connected and articulated to said supporting structure by means of a linear actuator having a first end articulated to said frame about a first axis and a second end articulated to said supporting structure about a second axis, said frame being moreover articulated to the associated array of photovoltaic modules at the respective long sides of each array.

8. The photovoltaic plant according to claim 7, wherein said linear actuator is operatively connected to an electronic control unit configured for governing retraction or extraction of a stem of said linear actuator so as to vary the orientation of said plane mirrors.

9. The photovoltaic plant according to claim 1, wherein the second end of the linear actuator is hinged at the geometrical centre of the dorsal surface of the corresponding deformable mirror.

10. The photovoltaic plant according to claim 1, wherein each deformable mirror comprises a deformable sheet of reflecting material.

11. A method for orienting an array of mobile reflection devices of a photovoltaic plant according to claim 1, the method comprising:
  a first step of detection, within the framework of a time interval having a predetermined duration, the values of one or more physical quantities which are representative of operative conditions of an installation site of the photovoltaic plant,
  a second step of calculation, within the framework of said time interval, of an inclination value of the array of mobile reflection devices as a function of detected values of said one or more physical quantities, a third step of comparison of the calculated inclination value with a theoretical and pre-calculated optimal inclination value, a fourth step of correction of said pre-calculated theoretical optimal inclination value with said calculated inclination value, wherein the first, the second, the third and the fourth steps are repeated along a sequence of time intervals having a predetermined duration.

12. The method according to claim 11, wherein said one or more physical quantities include:
   i) incident solar radiation;
   ii) string current;
   iii) height of the Sun,
   iv) direction and intensity of the wind; and
   v) inclination of the structure.

13. A method for the variation of the concavity of an array of mobile reflection devices of a photovoltaic plant according to claim 1, comprising the steps of:

detecting an intensity of the solar radiation in correspondence of each of said long sides of the associated array of photovoltaic modules; and controlling a movement of said actuator assembly in order to produce a variation of concavity of said mobile reflection devices as a function of the detected intensity of the solar radiation, wherein the step of controlling a movement of said actuator assembly is reiterated until a concavity is identified such that the values of intensity of the solar radiation in correspondence of each of said long sides of the associated array of photovoltaic modules are equal to maximum values for the respective long side.

14. The method according to claim 13, wherein said step of detecting the intensity of the solar radiation is carried out in a continuous way.

15. The method according to claim 13, wherein the intensity of the solar radiation at each of said long sides includes:

a lower-limit value equal to the value of intensity of the incident radiation in correspondence of the respective long side; and an upper-limit value, corresponding to the maximum value of intensity of the solar radiation that can be detected at the respective long side in a given condition of irradiation of the photovoltaic plant, said upper-limit value being equal to the sum of the value of intensity of the incident radiation at the respective long side and of the maximum value of intensity of the reflected radiation that can be detected at the respective long side.

* * * * *